(12) United States Patent
Ma et al.

(10) Patent No.: US 9,431,237 B2
(45) Date of Patent: Aug. 30, 2016

(54) POST TREATMENT METHODS FOR OXIDE LAYERS ON SEMICONDUCTOR DEVICES

(75) Inventors: Kai Ma, Palo Alto, CA (US); Christopher S. Olsen, Fremont, CA (US); Yoshitaka Yokota, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 608 days.

(21) Appl. No.: 12/762,467

(22) Filed: Apr. 19, 2010

(65) Prior Publication Data

US 2010/0267248 A1 Oct. 21, 2010

Related U.S. Application Data

(60) Provisional application No. 61/170,873, filed on Apr. 20, 2009.

(51) Int. Cl.
*H01L 21/02* (2006.01)
*H01L 21/28* (2006.01)
*H01L 21/3105* (2006.01)
*H01L 21/316* (2006.01)

(52) U.S. Cl.
CPC ..... *H01L 21/02164* (2013.01); *H01L 21/0234* (2013.01); *H01L 21/02252* (2013.01); *H01L 21/28247* (2013.01); *H01L 21/3105* (2013.01); *H01L 21/31654* (2013.01)

(58) Field of Classification Search
CPC ............ H01L 21/02164; H01L 21/02252; H01L 21/0234; H01L 21/28247; H01L 21/3105; H01L 21/31654

USPC ................... 438/787; 257/E21.271
See application file for complete search history.

(56) References Cited

U.S. PATENT DOCUMENTS

| | | | |
|---|---|---|---|
| 5,330,935 A | 7/1994 | Dobuzinsky et al. | |
| 6,028,015 A | 2/2000 | Wang et al. | |
| 6,346,488 B1 | 2/2002 | Kabansky | |
| 6,368,517 B1* | 4/2002 | Hwang et al. | 216/67 |
| 6,450,116 B1 | 9/2002 | Noble et al. | |
| 6,649,538 B1* | 11/2003 | Cheng et al. | 438/775 |
| 7,446,023 B2 | 11/2008 | Joshi et al. | |
| 7,601,651 B2* | 10/2009 | Balseanu et al. | 438/789 |
| 2002/0197880 A1* | 12/2002 | Niimi et al. | 438/763 |
| 2003/0207033 A1* | 11/2003 | Yim et al. | 427/255.37 |
| 2004/0152342 A1* | 8/2004 | Li et al. | 438/789 |
| 2004/0224537 A1* | 11/2004 | Lee et al. | 438/782 |

(Continued)

OTHER PUBLICATIONS

Lim, Kwan-Yong et al., "Highly Reliable and Scalable Tungsten Polymetal Gate Process for Memory Devices Using Low-Temperature Plasma Selective Gate Reoxidation", *Symposium on VLSI Technology Digest of Technical Papers* 2006, 2 pp.

*Primary Examiner* — Fernando L Toledo
*Assistant Examiner* — Neil Prasad
(74) *Attorney, Agent, or Firm* — Servilla Whitney LLC

(57) ABSTRACT

Methods and apparatus for post treating an oxide layer on a semiconductor substrate are disclosed. In one or more embodiments, the oxide layer is formed by thermal oxidation or plasma oxidation and treated with a plasma comprising helium. The helium-containing plasma may also include hydrogen, neon, argon and combinations thereof. In one or more embodiments, a $SiO_2$ oxide layer is formed on a silicon substrate and treated with a plasma to improve the interface between the silicon substrate and the $SiO_2$ oxide layer.

18 Claims, 3 Drawing Sheets

(56) References Cited

U.S. PATENT DOCUMENTS

| | | |
|---|---|---|
| 2006/0223315 A1 | 10/2006 | Yokota et al. |
| 2006/0237802 A1* | 10/2006 | Chen et al. .................. 257/408 |
| 2007/0202254 A1* | 8/2007 | Ganguli et al. ............... 427/252 |
| 2007/0212896 A1* | 9/2007 | Olsen et al. .................. 438/758 |
| 2008/0261366 A1* | 10/2008 | Jeon et al. .................... 438/257 |
| 2010/0255684 A1* | 10/2010 | Nishiguchi et al. .......... 438/789 |

* cited by examiner

POST TREATMENT METHODS FOR OXIDE LAYERS ON SEMICONDUCTOR DEVICES

CROSS REFERENCE TO RELATED APPLICATION

This application claims the benefit of priority under 35 U.S.C. §119(e) to U.S. Patent Application No. 61/170,873, filed Apr. 20, 2009, which is hereby incorporated by reference in its entirety.

FIELD OF THE INVENTION

Embodiments of the present invention generally relate to semiconductor fabrication, and more particularly, to oxidation of a semiconductor device or its components, and post-treatment methods for oxide films.

BACKGROUND OF THE INVENTION

Semiconductor devices typically require thin oxide layers to be formed at various stages of their fabrication. For example, in transistors, a thin gate oxide layer may be formed as part of a gate stack structure, including sidewalls, as will be described further below. In addition, in some applications, such as in the fabrication of a flash memory film stack, a thin oxide layer may be formed surrounding the entire gate stack, for example, via exposing the stack to an oxidation process. Such oxidation processes have conventionally been performed either thermally or using a plasma.

Thermal processes for forming oxide layers, for example, the gate oxide layer or the gate stack oxidation layer, have worked relatively well in fabrication of semiconductor devices of the larger feature sizes used in the past. Unfortunately, as feature sizes are becoming much smaller and different oxides are employed in the next generation of advanced technologies, the high wafer or substrate temperatures often required in thermal oxidation processes are problematic in that the dopants in the silicon wafer (well doped and junctions) diffuse at the higher temperatures (e.g., above about 700° C.). Such a distortion of the dopant profiles and other features can lead to poor device performance or failure.

The use of lower temperature or "cold" processing methods is increasing in microelectronic manufacturing due to the minimization of dopant redistribution and high-temperature related defects. Despite these benefits, plasma processes used to form oxide layers have problems to those presented by thermal oxidation processing. For example, plasma oxides can contain fatal defects in the gate oxide structure such as dangling bonds. For example, conventional oxidation processes often result in a defect known as a bird's beak. Bird's beak refers to diffusion of the oxide layer into the layers of the film stack structure from the sides at the interface between adjacent layers, rounding off the corners of the adjacent layers. The resultant oxide shape has a profile that resembles a bird's beak. The intrusion of the oxide layer into the active region of the memory cell (e.g., in flash memory applications) reduces the active width of the memory cell, thereby undesirably reducing the effective width of the cell and degrading the performance of the flash memory device.

Utilizing a plasma oxidation process to form oxide layers on substrate, for example silicon substrate, forms a plasma in the reactor which consumes the silicon substrate to forms a $SiO_2$ oxide layer on the silicon substrate. For at least this reason, plasma oxidation is thought to more likely produce an ideal Si—$SiO_2$ interface, which leads to high device performance and reliability. Further, plasma oxidation grows $SiO_2$ oxide layers having high electrical quality rapidly and at lower temperatures than thermal oxidation processes. Despite the lower processing temperature, the quality of the resulting oxide layers can degrade with reducing process temperature. This degradation of quality becomes more pronounced with oxide layers formed by plasma oxidation, when the oxidation temperature is below 700° C. Thus, there is a need for an improved method for forming oxide layers at lower temperatures.

SUMMARY

One aspect of the present invention relates to a method of treating an oxide layer that is formed on a semiconductor substrate. One or more embodiments of the method pertain to treating a silicon dioxide oxide layer formed on a silicon semiconductor substrate. According one of more embodiments of the method, the substrate is placed on a substrate support in a reaction chamber and an oxide having a thickness is formed on the stack. The support utilized in one or more embodiments of the present invention may include a stack that defines a horizontal surface and a sidewall, though other known supports may be used. Such embodiments also include treating the oxide layer with a post-treatment plasma. Optional embodiments of the method may also include annealing the oxide layer.

The post-treatment plasma according to one or more embodiments includes a helium-containing plasma. In a specific embodiment, the post-treatment plasma includes a hydrogen plasma, helium plasma or a neon plasma. In a specific embodiment, combinations of hydrogen plasma, helium plasma and neon plasma may be utilized in the post-treatment plasma. The plasma may be formed by introducing a post-treatment gas into the reaction chamber and energizing the post-treatment gas.

The post-treatment gas of one or more embodiments includes helium. In a specific embodiment, the post-treatment gas may also include other gases such as hydrogen, neon, argon and/or combinations thereof. In such embodiments, the helium gas includes at least 50% of the post-treatment gas while the remaining portion of the post-treatment gas includes one or more of hydrogen, neon, and/or argon. In one or more embodiments, helium is present in the post-treatment gas in a range from about 50% to about 95%. In such embodiments, the lower limit of helium may include 53%, 57%, 60%, 63%, and 67% of the post-treatment gas and the upper limit of helium may include 90%, 91%, 92%, 93% and 94% of the post-treatment gas and all ranges and sub-ranges therebetween. In a more specific embodiment, the post-treatment gas includes helium in an amount in the range from about 70% to about 95%. In such embodiments, the lower limit of helium may include 72%, 74%, 76% and 78% of the total post-treatment gas and the upper limit of helium may include 90%, 85%, and 80%, of the total post-treatment gas and all ranges and sub-ranges therebetween.

According to a second aspect of the present invention, a method for treating an oxide layer that is formed on a semiconductor substrate includes placing a substrate, which may include silicon, on a substrate support in a reaction chamber and an oxide having a thickness is formed on the stack. The oxide layer may include silicon dioxide and, in one or more embodiments, may be formed at temperatures above 700° C. In such embodiments, the substrate is removed from the reaction chamber and placed in a plasma reaction chamber. In a specific embodiment, the substrate is removed from the reaction chamber and placed in the plasma chamber under vacuum conditions. The oxide layer is then treated with a post-treatment plasma, as described herein. Optional embodiments of the method may also include annealing the oxide layer.

According to one or more embodiments, at least one of properties of the oxide layer is improved by the methods of treatment described herein. In a specific embodiment, the one or more properties are improved by treating the oxide layer with a post-treatment plasma. For example, in embodiments utilizing a silicon substrate and a silicon dioxide oxide layer, the interface between the silicon and the silicon dioxide is improved. Alternative embodiments which utilize a helium-containing plasma result in an oxide layer with improved oxygen content. In one or more specific embodiments, the oxygen content of the oxide layer is improved to at least 65%. In a more specific embodiment, the oxygen content is improved to an amount in the range from about 65% to about 73%. Embodiments utilizing helium-containing plasma to treat the oxide layer may also reduce changes in the oxide layer thickness when the oxide layer is exposed to high temperatures.

The foregoing has outlined rather broadly certain features of the present invention. It should be appreciated by those skilled in the art that the specific embodiments disclosed may be readily utilized as a basis for modifying or designing other structures or processes within the scope of present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide post-treatment methods for oxide layers formed by oxidation of semiconductor substrates. Specific embodiments described below are described with reference to oxide layers formed by low temperature oxidation. As used herein, low temperature oxidation refers to oxidation at temperatures below about 700° C. Conventional plasma oxidation occurs at temperatures above 100° C. due to plasma power transferred to the substrate.

However, the present invention is not limited to a particular oxidation method, and the post-treatment methods described herein can be used on oxide layers formed by other oxidation techniques, including but not limited to thermal oxidation techniques (e.g., those performed above 700° C.), and oxide layers formed using carbon dioxide SNOW process, viscous flowable CVD, or spin-on-dielectrics (SOD). As used herein, thermal oxidation refers to oxidation processes performed above about 700° C.

Figure 1:
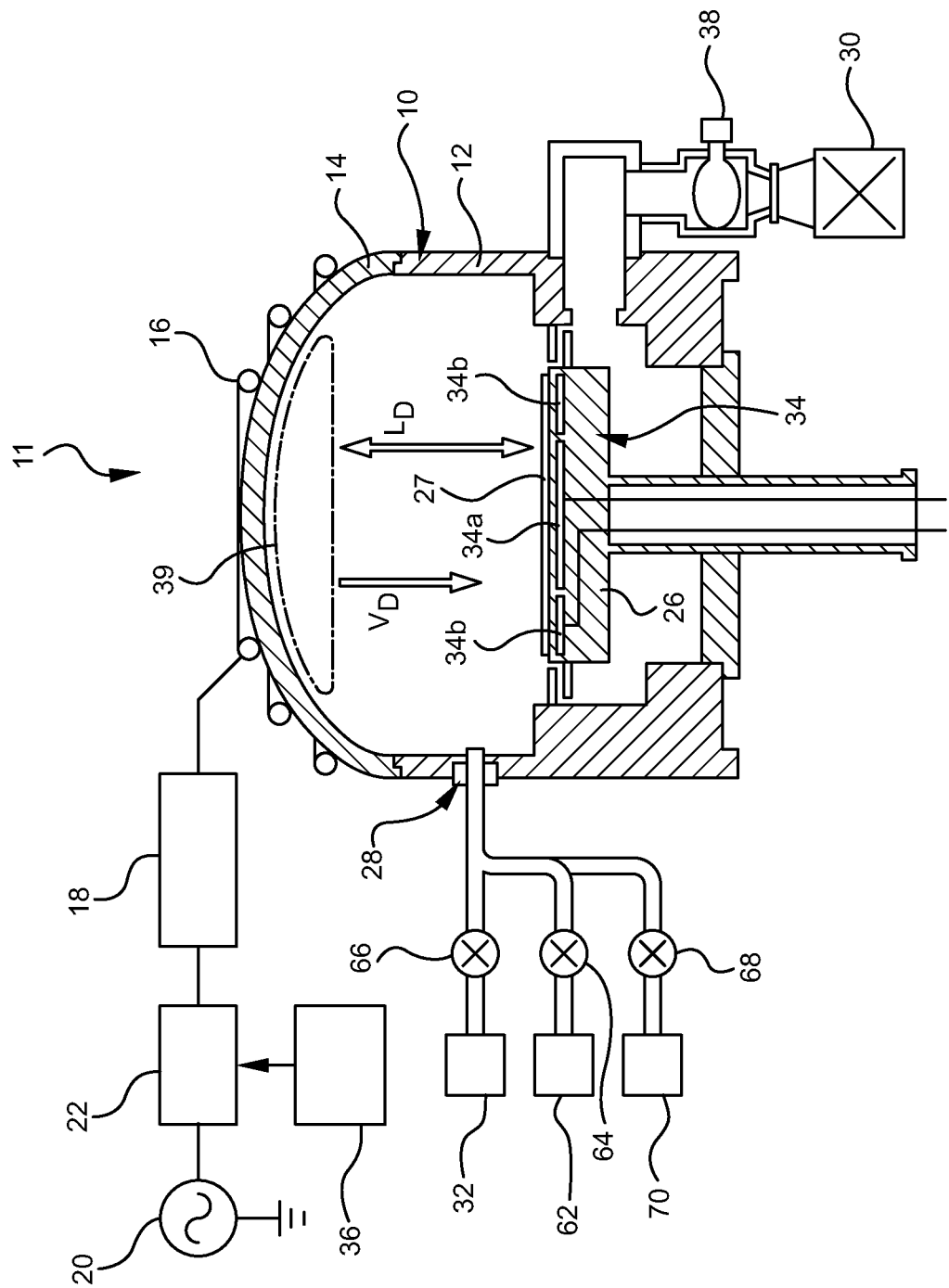
FIG. 1 illustrates a plasma reactor according to an embodiment of the invention.

Embodiments of the present invention may be carried out in suitably equipped plasma reactors, such as Decoupled Plasma Nitridation (DPN) reactors available from Applied Materials, Inc., of Santa Clara, Calif. Other suitable plasma reactors may also be utilized, including, but not limited to a radial line slot antenna plasma apparatus and a hollow cathode plasma apparatus. FIG. 1 depicts an illustrative plasma reactor suitable for carrying out oxide formation processes in accordance with embodiments of the present invention. The reactor may provide a low ion energy plasma and a high ion energy plasma via inductively coupled plasma source power applicators driven by continuous wave (CW) power generators.

The reactor 11 shown in FIG. 1 includes a chamber 10 having a cylindrical side wall 12 and a ceiling 14 which may be either dome-shaped (as shown in the drawing), flat, or another geometry. A plasma source power applicator comprises a coil antenna 16 disposed over the ceiling 14 and coupled through a first impedance match network 18 to a power source. The source comprises an RF power generator 20 and a gate 22 at the output of the generator 20.

The reactor also includes a substrate support pedestal 26, which may be an electrostatic chuck or other suitable substrate support, for holding a semiconductor substrate 27 such as a 200 mm or 300 mm semiconductor wafer or the like. Typically, there is a heating apparatus such as a heater 34 beneath the top surface of the substrate support pedestal 26. The heater 34 may be a single or multiple zone heater, such as a dual radial zone heater having radial inner and outer heating elements 34a and 34b, as depicted in FIG. 1.

In addition, the reactor includes a gas injection system 28 and a vacuum pump 30 coupled to the interior of the chamber 10. The gas injection system 28 is supplied by a gas source, which may include an oxygen container 32, a hydrogen container 62 or a noble gas container 70. Other process gas sources may be included, such as a water vapor source and an inert gas source (not shown). In one or more embodiments, more than one gas source can be utilized. Flow control valves 66, 64 and 68 are coupled to the oxygen container 32, the hydrogen container 62 and the noble gas container 70, respectively, and may be utilized to selectively provide process gases or process gas mixtures to the interior of the chamber 10 during processing. Other gas sources (not shown) for providing additional gases such as nitrogen, gaseous mixtures, or the like may also be provided. The pressure inside the chamber 10 may be controlled by a throttle valve 38 of the vacuum pump 30.

The duty cycle of the pulsed RF power output at the gate 22 may be controlled by controlling the duty cycle of a pulse generator 36. Plasma is generated in an ion generation region 39 corresponding to a volume under the ceiling 14 surrounded by the coil antenna 16. As the plasma is formed in an upper region of the chamber 10 at a distance from the substrate 27, the plasma is referred to as a quasi-remote plasma (e.g., the plasma has benefits of remote plasma formation, but is formed within the same chamber 10 as the substrate 27.)

In operation, the plasma reactor may be employed to carry out oxidation processes in accordance with embodiments of the present invention to deposit high quality oxide layers having increased oxide layers on sidewalls of oxide stacks formed on a substrate.

Figure 2A:
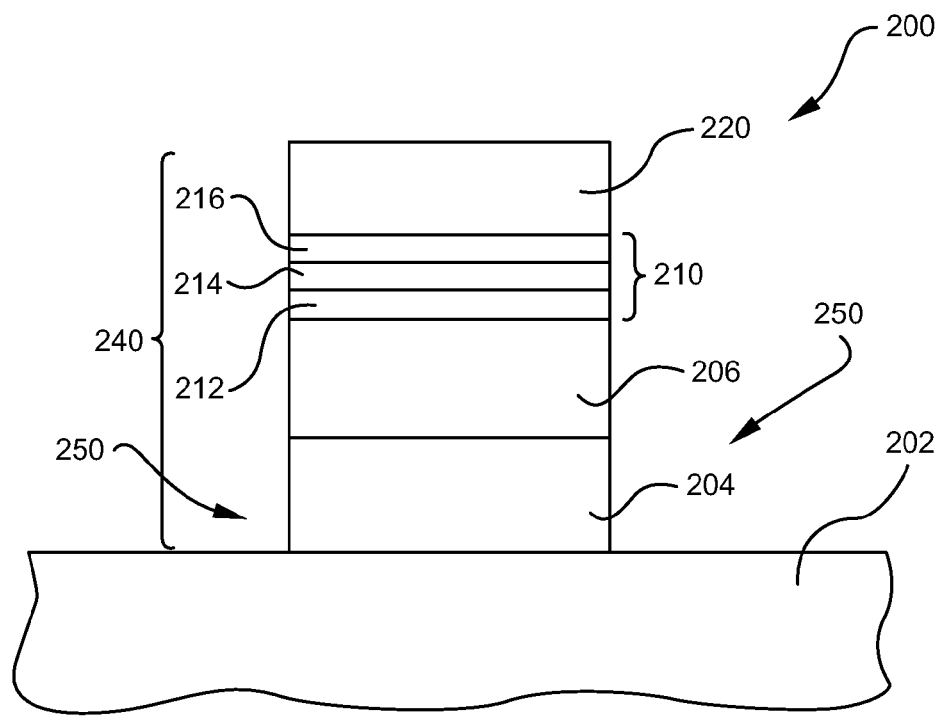
FIGS. 2A-2B illustrate sequential changes in a semiconductor structure during a process according to an embodiment of the invention.
Figure 2B:
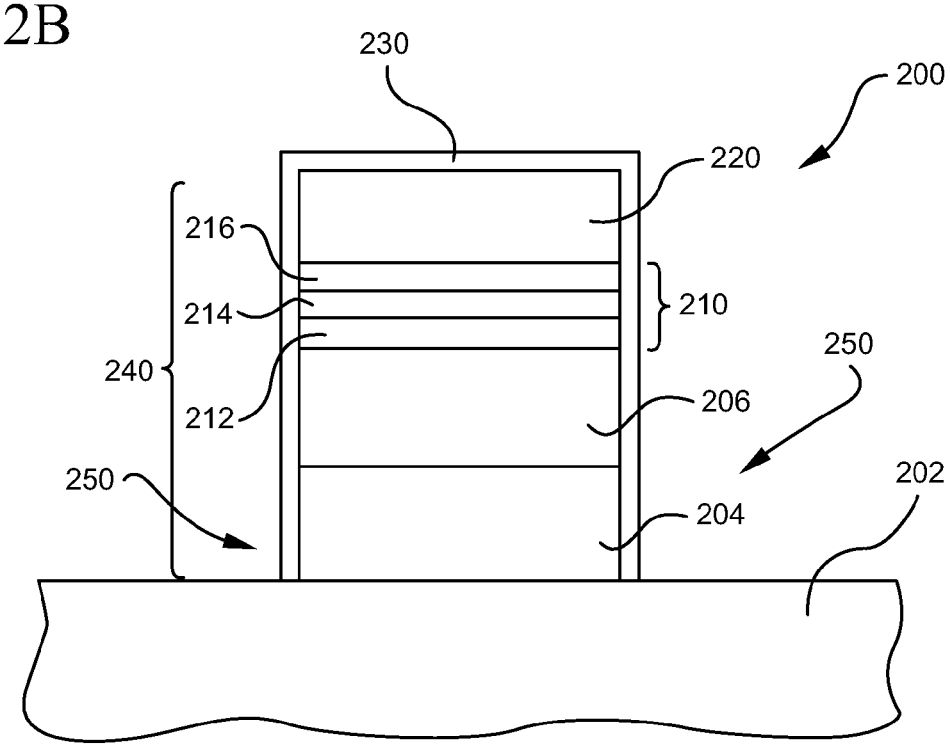

FIGS. 2A-B depict stages of fabrication of a semiconductor structure 200 including a film stack 240 formed over a semiconductor substrate 202. In one or more embodiments, the substrate 202 may include multiple film stacks 240 forming trenches 250 between the stacks. The process described herein for fabrication of the semiconductor structure 200 may be performed, for example, in the reactor 11 described above with respect to FIG. 1.

Substrate 202 has a film stack 200 disposed thereon. The film stack 200 is to be oxidized. The substrate 202 generally corresponds to the substrate 27 of FIG. 1 and is generally supported on the substrate support 26 in the chamber 10 of the plasma reactor 11. The substrate 202 may have various dimensions, such as 200 or 300 mm diameter wafers, as well as rectangular or square panels. In some embodiments, the film stack 202 may be formed upon the substrate 202 and then provided to the chamber 10 for the oxidation process. For example, the film stack 202 may be fabricated in one or more process chambers coupled to a cluster tool that also has the plasma reactor 11 coupled thereto. One example of a suitable cluster tool is a Gate Stack CENTURA®, available from Applied Materials, Inc., of Santa Clara, Calif.

The substrate 202 may be a variety a shapes and dimensions, for example, in the shape of a substantially circular wafer with a 200 or 300 mm diameter. Alternatively, the wafers may be other shapes such as rectangular or square. The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

It will be understood that the film stack 240 is not limited to the particular materials described above. Thus, the film stack 240 may be any stack of materials to be oxidized. For example, in some embodiments, such as in flash memory applications, the stack 200 may be a gate stack of a flash memory cell comprising a tunnel oxide layer 204, a floating gate layer 206, a single or multi-layer dielectric layer comprising the Interpoly Dielectric (IPD) 210 (a non-limiting example of the IPD is a multi-layer ONO layer comprising an oxide layer 212, a nitride layer 214, and an oxide layer 216 is illustratively shown in FIGS. 2A-B), and a control gate layer 220. The oxide layers 204, 212, 216 typically comprise silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer comprising $SiO_2/Al_2O_3/SiO_2$ can also be used as the IPD layer 210. The floating gate layer 206 and the control gate layer 220 typically comprise a conductive material, such as polysilicon, metals, or the like. It is contemplated that film stacks in other applications may be advantageously oxidized in accordance with the teachings provided herein, such as dynamic random access memory (DRAM) metal electrode/polysilicon gate stacks, Charge Trap Flash (CTF) for Non-volatile Memory (NVM), or the like. The DRAM metal electrode is typically tungsten (W) with interlayers of titanium nitride (TiN) or tungsten nitride (WN) between the tungsten and polysilicon layers. Charge Trap Flash (CTF) for Non-volatile Memory (NVM) uses a $SiO_2/SiN/Al_2O_3$ gate stack with a metal electrode of tantalum nitride (TaN) or titanium nitride (TiN) that may also benefit from sidewall oxidation after gate etch. In some embodiments, the process gas may include water vapor, and in one or more specific embodiments, the water vapor may be mixed with at least one of hydrogen and/or oxygen gas. Alternatively or in combination, the water vapor may be mixed with at least one inert gas, such as helium (He), argon (Ar), krypton (Kr), neon (Ne), or the like.

In some embodiments, the process gas (or gas mixture) may be provided at total flow rate of in the range of about 100-2000 sccm, or at about 400 sccm. For example, in embodiments where both oxygen ($O_2$) and hydrogen ($H_2$) are provided, the oxygen ($O_2$) and hydrogen ($H_2$) may be provided in a total flow rate of in the range of about 100-2000 sccm, or at about 400 sccm, in the percentage ranges described above. In embodiments where water vapor is provided, the water vapor may be introduced at a flow rate of in the range of about 5-1000 sccm with one or more inert carrier gases such as helium, argon, krypton, neon or other suitable inert gases. The inert gases may be provided as necessary to provide a total flow rate of in the range of about 100-2000 sccm and to provide a process gas mixture having up to about 50 percent water vapor. Inert gas additions may also be used with the $H_2/O_2$ mixture to prevent recombination of the ionized oxygen and/or hydrogen. Excited diatomic molecules typically tend to recombine with themselves in a plasma, so the addition of inert gases (such as Ar, He, Kr, Ne, or the like) may facilitate higher oxidation rates.

A plasma is generated from the process gases within the chamber 10 to form an oxide layer 230 over the film stack 240. The plasma is formed in the ion generation region 39 of the chamber 10 of FIG. 1 via inductive coupling of RF energy from the coil antenna 16 disposed over the ceiling 14, thereby advantageously providing a low ion energy (e.g., less than about 5 eV for pulsed plasmas and less than 15 eV for CW plasmas). The low ion energy of the plasma limits ion bombardment damage and facilitates oxidation of the sidewalls of the film stack 240 while limiting diffusion of oxygen between the layers thereof, thereby reducing bird's beak.

In some embodiments, about 25 to 5000 watts of power may be provided to the coil antenna 16 at a suitable frequency to form a plasma (for example, in the MHz or GHz range, or about 13.56 MHz or greater). The power may be provided in a continuous wave or pulsed mode. In one or more embodiments, the power is provided in a pulsed mode with duty cycle in the range of about 2 to 70 percent.

For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the ion generation region 39. The ion generation region 39 is elevated a significant distance LD above the substrate 27. Plasma generated in the ion generation region 39 near the ceiling 14 during the "on" time drifts at an average velocity VD toward the substrate 27 during the "off" time. During each "off" time, the fastest electrons diffuse to the chamber walls, allowing the plasma to cool. The most energetic electrons diffuse to the chamber walls at a much faster velocity than the plasma ion drift velocity VD. Therefore, during the "off" time, the plasma ion energy decreases significantly before the ions reach the substrate 27. During the next "on" time, more plasma is produced in the ion generation region 39, and the entire cycle repeats itself. As a result, the energy of the plasma ions reaching the substrate 27 is significantly reduced. At the lower range of chamber pressure, namely around 10 mTorr and below, the plasma energy of the pulsed RF case is greatly reduced from that of the continuous RF case.

The "off" time of the pulsed RF power waveform and the distance LD between the ion generation region 39 and the substrate 27 should both be sufficient to allow plasma generated in the ion generation region 39 to lose a sufficient amount of its energy so that it causes little or no ion bombardment damage or defects upon reaching the substrate 27. Specifically, the "off" time is defined by a pulse frequency in the range of about 2 and 20 kHz, or at about 10 kHz, and an "on" duty cycle in the range of about 5% and 50%. Thus, in some embodiments, the "on" interval may last in the range of about 5-50 microseconds, or about 20 microseconds and the "off" interval may last in the range of about 50-95 microseconds, or about 80 microseconds.

In some embodiments, the ion generation region-to-substrate distance LD is greater than about 2 cm, or in the range of about 2-20 cm. The ion generation region to substrate distance LD can be about the same as (or greater than) the distance VD times the "off" time traveled by the plasma ions during a single "off" time of the pulsed RF power waveform.

In both the continuous wave and the pulsed mode, the plasma advantageously balances the cogeneration of oxygen and hydrogen ions within the chamber and close enough to the substrate to limit the loss of reactivity of the ions with control of the ion energy to prevent ion bombardment induced damage or diffusion damage (e.g., bird's beak).

The plasma generated may be formed in a low pressure process, thereby reducing the likelihood of contamination induced defects. For example, in some embodiments, the chamber 10 may be maintained at a pressure of in the range of about 1-500 mTorr. Moreover, ion bombardment-induced defects that would be expected at such a low chamber pressure levels may be limited or prevented by using the quasi-remote plasma source and, optionally, by pulsing the plasma source power as described above.

According to one or more embodiments, the oxide layer 230 may be formed to a thickness in the range of between 20 Angstroms to 100 Angstroms, for example in the range of about 30 Angstroms to 70 Angstroms. The process may provide growth rates of oxide films in the range of about 7-100 Angstroms per minute, or at least about 25 Angstroms per minute. The inventive process disclosed herein provides the oxide growth rate enhancement described above at a lower thermal budget, thereby further limiting diffusion effects by reducing the exposure time of the substrate to the process as compared to conventional oxidation processes. In some embodiments, the process may have a duration of in the range of about 5 seconds to 300 seconds.

The oxide layer 230 can be formed to a desired thickness over the film stack 200. The substrate 202 may be subsequently further processed as necessary to complete the structures being fabricated thereon.

Although the present invention is illustrated above with reference to a flash memory film stack, the present invention can also be used to advantage to oxidize other transistor gate stacks, other material stacks, or to form oxide layers on substrates in various other applications.

Post-Treatment

Oxide layers formed by thermal or plasma oxidation processes may lack sufficient quality and reliability in quality needed for some applications. As stated above, problems with quality are more pronounced with lower temperature processes. It has been found that post-treating the oxide layers formed by either thermal oxidation or plasma oxidation with a post-treatment plasma results in more reliable oxide layers and enhanced oxide quality. Specifically, it is believed that the energy of the post-treatment plasma alters the atomic structure and film composition of oxide layers and, therefore improves film quality. It has also been found that post-treatment also enhances the density of the oxide layer. Improvement of these properties, in turn, is believed to enhance semiconductor device performance.

After formation of an oxide layer, according to one or more embodiments described herein, post-treatment of the oxide layer includes exposing the oxide layer to a post-treatment plasma. The oxide layer can be post-treated in any plasma reactor, such as the reactor 11 described above with reference to FIG. 1. In embodiments in which the oxide film is not formed by plasma oxidation, it will be understood that the oxide film may be formed in a separate chamber, and the post-treatment of the oxide film would be performed in a plasma oxidation chamber. In embodiments in which the film is formed by plasma oxidation, the post-treatment of the oxide film may be performed in same chamber, or in a different chamber.

Where different chambers are used, formation of the oxide layer and the post-treatment of the oxide layer may occur under load-locked conditions. According to one or more embodiments, a cluster system can be used for forming an oxide layer by thermal oxidation and post-treating the oxide layer with a post-treatment plasma in a separate chamber. In one or more embodiments, the cluster system is a load locked system under vacuum pressure that prevents exposure of the substrate to ambient conditions between formation of the oxide layer and the post-treatment process. As described herein, a suitable cluster tool is a Gate Stack CENTURA®, available from Applied Materials, Inc. of Santa Clara, Calif.

Other embodiments of multi-chamber systems known in the may be utilized with the post-treatment process described herein. In one or more embodiments, a plasma oxidation chamber is connected to a thermal oxidation chamber by an outlet passageway. In one or more embodiments, changes in pressure in the thermal oxidation chamber and plasma oxidation chamber allow a plasma formed in the plasma oxidation chamber to travel through the outlet passageway to the thermal oxidation chamber.

In one or more embodiments, the post-treatment plasma may be formed from helium gas. In a specific embodiment, the post-treatment plasma may be formed by a helium-containing gas which further includes hydrogen gas, neon gas, argon gas and/or combinations thereof. According to one or more embodiments, helium, hydrogen, and neon gases used to form the post-treatment plasma maybe supplied to the chamber at a flow rate in the range of about 50 sccm to 1000 sccm. In a specific embodiment, the flow rate is in the range from about 100 sccm to about 500 sccm. In a specific embodiment, the helium, hydrogen, and neon gases are supplied to the chamber at a pressure in the range of about 5 mTorr to about 500 mTorr and, in a more specific embodiment, the gases are supplied at a pressure in the range of about 1 mTorr and 100 mTorr.

In one or more embodiments, the helium, hydrogen, neon, and argon gases may be supplied to the chamber in combination. According to one or more embodiments, percentage of helium gas in the total gas supplied to the chamber is in the range from about 50% to about 100%. In a specific embodiment, the percentage of helium gas in the total gas supplied is in the range from about 50% to 95% and, in a more specific embodiment, in the range from about 70% to about 95%.

One or more embodiments of the post-treatment processes described herein can be used after the formation of a $SiO_2$ oxide layer in a plasma reactor. In one or more embodiments, the $SiO_2$ oxide layer can be formed from either pure $O_2$ plasma, $O_3$ plasma, a mixture of $O_2$ and hydrogen gas, a mixture of $O_2$, hydrogen and a noble gas (such as He, Ar, Ne, or Xe), or a mixture of $O_2$ and/or hydrogen and a nitrogen-containing gas. The oxide layer is then treated with a post-treatment plasma. According to one embodiment, helium gas, hydrogen gas, neon gas and/or a combination of these gases are supplied to the chamber of the plasma reactor, for example the chamber 10 of FIG. 1. A post-treatment plasma is formed in the chamber 10 in the ion generating region 39.

In one or more embodiments, a post-oxidation-anneal ("POA") method are used to improve film quality before or after the substrate is subjected to post-treatment with a plasma. In specific embodiments, POA can be combined with post-treatment methods described herein. In one or more embodiments, the substrate is moved to a rapid thermal chamber for annealing. In one or more embodiments, the substrate is annealed at a temperature in the range from about 400° C. to about 1100° C. in a rapid thermal chamber while flowing either a nitrogen gas, an argon gas, a hydrogen gas, an ammonia gas, other inert gases, or combination of these gases. In a specific embodiment, the substrate is annealed at a temperature of about 1000° C. In a more specific embodiment, the substrate is annealed by heating the substrate in an RTA chamber and flowing a nitrogen or inert gas into the chamber at 1000° C. for a duration from about 15 seconds to about 60 seconds.

Embodiments of the invention may be more readily understood by the following non-limiting examples.

EXAMPLES $SiO_2$ layers were formed on four silicon substrates (Substrates A-D). The $SiO_2$ layers were formed in a decoupled plasma oxidation ("DPO") reactor using plasma oxidation. The initial thickness of the $SiO_2$ layer on Substrates A-D, before post-treatment, measured 41 Angstroms The $SiO_2$ layer of substrate A was not subjected to post-treatment with a plasma in the DPO reactor but instead was annealed at a temperature of 1000° C. for 15 seconds in nitrogen gas in an RTA chamber. The $SiO_2$ layer of substrate B was post treated with an argon plasma in the DPO reactor and annealed as described with reference to Substrate A. The $SiO_2$ layer of Substrate C was post-treated with hydrogen plasma in the DPO reactor and annealed as described with reference to Substrate A. The $SiO_2$ layer of Substrate D was post treated with helium plasma in the DPO reactor and annealed as described with reference to Substrate A.

The "thickness shrinkage" of the $SiO_2$ layers of Substrates A-D was measured to determine the changes in the thickness of the $SiO_2$ layers before and after annealing. A greater change in thickness indicates a less dense layer while a smaller change in thickness indicates a denser layer. "Thickness shrinkage" is determined by calculating the difference between the thickness of a $SiO_2$ layer before annealing (and after plasma treatment, if applicable) and the thickness of this $SiO_2$ layer after annealing. The thicknesses of the layers were in the range of about 30 and 70 Angstroms. This difference is then divided by the thickness of a $SiO_2$ layer before annealing (and after plasma treatment, if applicable). The thickness shrinkage of Substrates A-D is shown in Table 1.

TABLE 1

Thickness Shrinkage of $SiO_2$ layers of Substrates A-D

| Thickness (Å) of $SiO_2$ layer | Thickness Shrinkage % after POA only | Thickness Shrinkage % after POA and plasma treatment |
|---|---|---|
| Substrate A | 17% | N/A |
| Substrate B | N/A | 12% |
| Substrate C | N/A | 11% |
| Substrate D | N/A | 5% |

As can be seen by the information in Table 1, $SiO_2$ layers subjected to post-treatment with a plasma (Substrates B-D) exhibited reduced thickness shrinkage than $SiO_2$ layers which were only annealed and not post treated with a plasma (Substrate A). As discussed above, reduced thickness shrinkage indicates a denser $SiO_2$ layer or a more ideal $SiO_2$ layer. Out of the three post-treatment plasmas used to treat Substrates B-D, treatment with helium plasma results in the least thickness shrinkage. Based on the results in Table 1, it is believed that post-treatment of a $SiO_2$ layer formed by plasma oxidation improves density of the $SiO_2$ layer.

Porous $SiO_2$ layers often lead to poor electrical properties which cause poor device performance. Accordingly, it is believed that improving the density of a $SiO_2$ layer will improve performance of a device As noted above, despite helium plasma's lower mass, post-treatment with helium plasma improves density of the $SiO_2$ layer to a greater degree than treatment with argon plasma or hydrogen plasma. Helium plasma has a high ionization threshold and a small collisional cross-section, while argon plasma has a lower ionization threshold and a larger collisional cross-section. It has been observed, through experimentation, that electron temperature is inversely proportional to collisional cross-section. Accordingly, among helium plasma, hydrogen plasma and argon plasma, at the same pressure, helium plasma has the highest electron temperature while argon plasma has the lowest electron temperature and hydrogen plasma has an electron temperature between helium plasma and argon plasma. It is believed that neon plasma also has an electron temperature between helium plasma and argon plasma. Helium plasma has a higher electron temperature and is, therefore, considered a "hot" plasma or "high energy plasma." Plasmas with lower ionization energies (such as argon plasma) have lower electron temperatures and are, therefore, considered "lower energy plasma." Accordingly, based on the data in Table 1, it is believed that high energy plasmas, such as helium plasma, improve the density of $SiO_2$ layers, despite having a lower mass.

Figure 3:
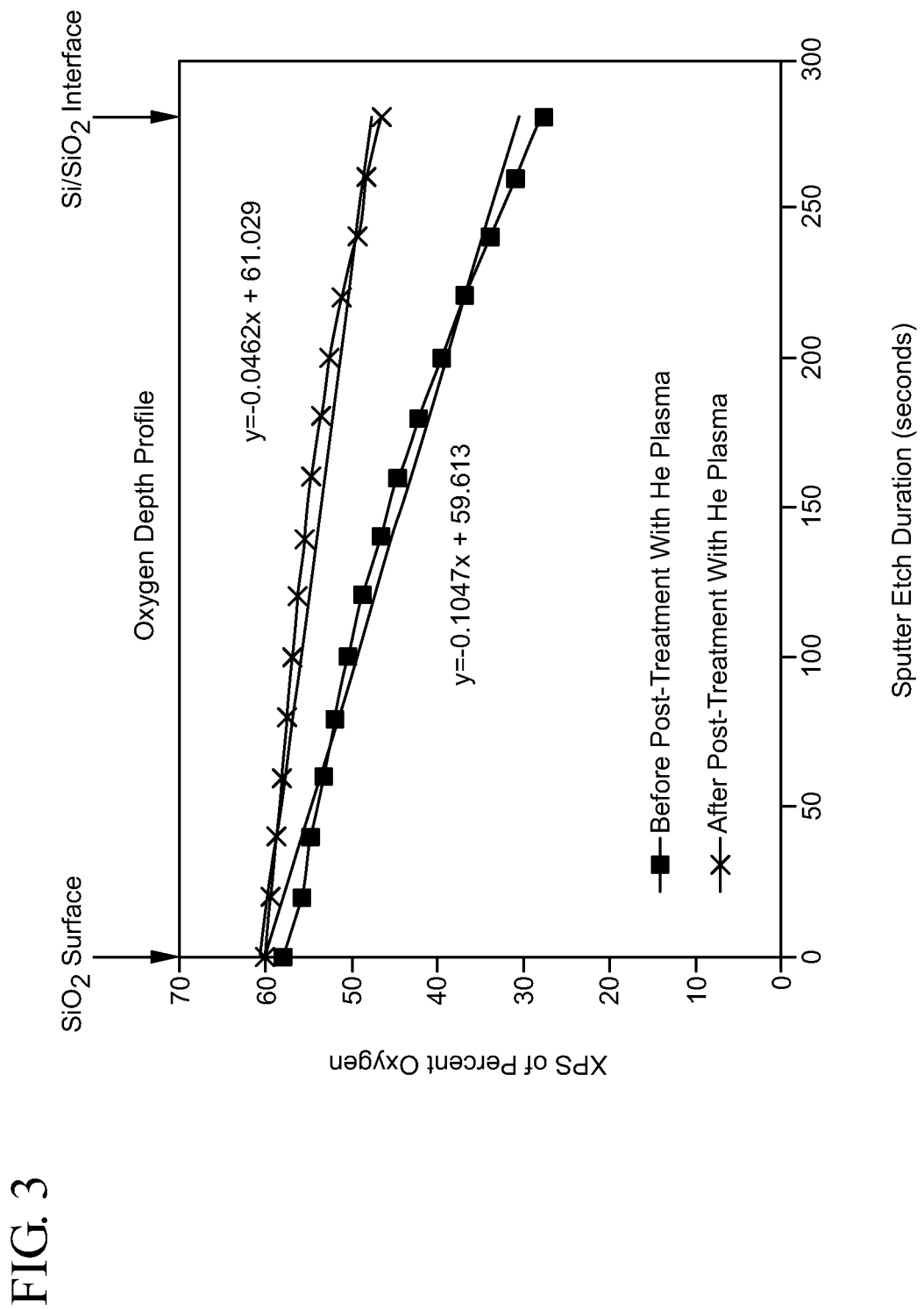
FIG. 3 shows a graph of the oxygen slope profile of a silicon substrate with a $SiO_2$ layer disposed thereon before post-treatment with a helium plasma and after post-treatment with a helium plasma.

As discussed herein, it is believed that post-treatment with a plasma modifies the oxygen content of the oxide layer. Referring to FIG. 3, the oxygen content and distribution of a $SiO_2$ layer disposed on a substrate (Substrate E) was measured using X-ray photoelectron spectroscopy (XPS) before plasma treatment with helium plasma and after plasma treatment with helium plasma. Generally, the oxygen slope profile of a $SiO_2$ layer formed by plasma oxidation indicates the content of oxygen in the $SiO_2$ layer as a function of the depth of the SiO$_2$ layer. It is believed that oxygen content evenly distributed throughout the SiO$_2$ layer indicates a SiO$_2$ film with reduced defectivity. As otherwise discussed herein, improved SiO$_2$ film quality leads to high device performance and reliability.

The graph of FIG. 3 shows the percentage of oxygen in the SiO$_2$ layer from the surface of the SiO$_2$ layer to the interface between the silicon substrate and the SiO$_2$ layer before and after post-treatment with helium plasma. As is shown in FIG. 3, the slope of the oxygen profile is reduced by half, indicating more uniform oxygen distribution in the SiO$_2$ layer. In addition, post-treatment with helium plasma produces a SiO$_2$ layer where the percentage of oxygen in the SiO$_2$ layer is maintained at a more constant level from the surface to the Si/SiO$_2$ interface.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of treating an oxide layer on a semiconductor substrate, comprising:
   placing a substrate on a substrate support in a reaction chamber, the substrate having a stack defining a horizontal surface and a sidewall;
   forming an oxide layer on the stack, the oxide layer having a thickness; and
   treating the oxide layer with a post-treatment plasma, at a temperature below 600° C., the post-treatment plasma formed by introducing a post-treatment gas to the reaction chamber, the post-treatment gas comprising a gas selected from the group consisting of helium, hydrogen, neon, argon and combinations thereof, with the proviso that helium comprises at least about 50% of the post-treatment gas and treating the oxide layer increases the oxygen content uniformity of the oxide layer.

2. The method of claim 1 wherein the post-treatment gas comprises helium and hydrogen.

3. The method of claim 1, wherein the post-treatment gas comprises helium and neon.

4. The method of claim 1, wherein the post-treatment gas comprises helium and argon.

5. The method of claim 1, wherein the substrate comprises silicon and the oxide layer comprises silicon dioxide and treating the substrate provides a substrate with an improved interface between the silicon and silicon dioxide.

6. The method of claim 1, further comprising annealing the oxide layer.

7. A method of treating an oxide layer on a semiconductor substrate, comprising:
   placing a substrate including a stack defining a horizontal surface and a sidewall on a substrate support in a reaction chamber;
   forming an oxide layer on the stack, the oxide layer having a thickness; and
   treating the oxide layer with a helium-containing plasma at a temperature below 600° C. to change a property of the oxide layer, the helium-containing plasma comprising helium and a gas selected from the group consisting of neon, argon, hydrogen and combinations thereof, with the proviso that helium makes up about 50% to about 95% of the composition of the helium-containing plasma.

8. The method of claim 7, wherein the oxide layer is formed at a temperature above 700° C.

9. The method of claim 8, further comprising removing the substrate from the reaction chamber and placing the substrate in a plasma reaction chamber before treating the oxide layer with a helium-containing plasma.

10. The method of claim 9, wherein the post-treatment plasma is formed by introducing a helium-containing gas to the plasma reaction chamber and energizing the helium-containing gas.

11. The method of claim 7, further comprising annealing the oxide layer.

12. The method of claim 9, wherein the substrate is removed from the reaction chamber and placed in a plasma reaction chamber under vacuum conditions.

13. The method of claim 7, wherein the substrate comprises silicon and the oxide layer comprises silicon dioxide and treating the substrate provides a substrate with an improved interface between the silicon and silicon dioxide.

14. The method of claim 7, wherein treating the oxide layer with a helium-containing plasma improves the oxygen content of the oxide layer.

15. The method of claim 14, wherein the oxygen content of the oxide layer is in an amount in the range from about 65% to about 73%.

16. The method of claim 12, wherein treating the oxide layer with a helium-containing plasma reduces changes in the thickness of the oxide layer when exposing to high temperature.

17. A method of treating a silicon oxide layer on a semiconductor substrate, comprising:
   forming a silicon oxide layer having a thickness in the range of about 30 Å to about 70 Å over a film stack comprising a horizontal surface and sidewalls, wherein the silicon oxide layer is formed at a temperature below 700° C.;
   treating the oxide layer with a helium-containing plasma formed by a helium containing gas which further includes hydrogen gas, neon gas, argon gas and/or combinations thereof; and
   treating the silicon oxide layer over the film stack with a post oxidation anneal at a temperature in the range from about 400° C. to about 1,100° C., after treatment with the helium-containing plasma, wherein the thickness of the silicon oxide layer over the film stack has a reduction in thickness of less than 11% after the post oxidation anneal.

18. The method of claim 17, wherein the film stack is a flash memory cell comprising a tunnel oxide layer, a floating gate layer, and a single or multi-layer dielectric layer.

\* \* \* \* \*